(12) United States Patent
Perahia et al.

(10) Patent No.: US 9,334,153 B1
(45) Date of Patent: May 10, 2016

(54) MEMS DEVICE CONNECTED TO A SUBSTRATE BY FLEXIBLE SUPPORT STRUCTURES

(71) Applicant: HRL LABORATORIES LLC, Malibu, CA (US)

(72) Inventors: Raviv Perahia, Los Angeles, CA (US); Hung Nguyen, Los Angeles, CA (US); Richard J. Joyce, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/531,861

(22) Filed: Nov. 3, 2014

(51) Int. Cl.
*B81B 7/00* (2006.01)
*B81C 1/00* (2006.01)

(52) U.S. Cl.
CPC ........... *B81B 7/0006* (2013.01); *B81C 1/00301* (2013.01); *B81B 7/0016* (2013.01); *B81B 7/0019* (2013.01)

(58) Field of Classification Search
CPC .................. H01L 2924/14; H01L 2924/01079
USPC .......................................... 257/773; 438/117
See application file for complete search history.

(56) References Cited

U.S. PATENT DOCUMENTS

| | | | | |
|---|---|---|---|---|
| 5,938,452 | A | * | 8/1999 | Wojnarowski ................. 439/67 |
| 6,657,525 | B1 | * | 12/2003 | Dickens et al. ................. 335/78 |
| 7,237,315 | B2 | | 7/2007 | Kubena et al. |
| 2008/0135385 | A1 | * | 6/2008 | Steeneken et al. ............ 200/181 |
| 2009/0085191 | A1 | * | 4/2009 | Najafi et al. .................. 257/698 |
| 2012/0139389 | A1 | * | 6/2012 | Bohringer et al. ............ 310/300 |
| 2013/0335011 | A1 | * | 12/2013 | Bohringer et al. ............ 320/107 |
| 2014/0192397 | A1 | * | 7/2014 | Atnip ............................ 359/291 |

OTHER PUBLICATIONS

J. R. Vig, "Quartz Crystal Resonators and Oscillators for Frequency Control and Timing Applications—A Tutorial" Jan. 2007.
R. Filler, "The Acceleration Sensitivity of Quartz Crystal Oscillators: A Review", IEEE Transactions of Ultrasonics, Ferroelectrics, and Frequency Control, Vo. 35 No. 3, 1998.
S.W. Yoon, "Vibration Isolation and Shock Protection for MEMS", Michigan University Thesis, 2009.
Microsystem Design, by S.D. Senturia, 2005, ISBN 0-7923-7246-8 (book).

* cited by examiner

*Primary Examiner* — Fernando L Toledo
*Assistant Examiner* — Adam S Bowen
(74) *Attorney, Agent, or Firm* — Ladas & Parry

(57) ABSTRACT

A MEMS assembly comprising a substrate and a MEMS device; wherein the MEMS device is connected to the substrate by at least two flexible support structures made in a conductive layer formed on a first portion of one of the substrate and the MEMS.

20 Claims, 5 Drawing Sheets led# MEMS DEVICE CONNECTED TO A SUBSTRATE BY FLEXIBLE SUPPORT STRUCTURES

REFERENCE TO A CONTRACT

This disclosure relates to work performed under Government contract No. HR0011-10-C-0109: Dynamics-Enabled Frequency Sources.

INCORPORATION BY REFERENCE

The present disclosure relates to U.S. Pat. No. 7,237,315, issued on Jul. 3, 2007, which is hereby incorporated by reference.

TECHNICAL FIELD

This disclosure relates to a flexible mount for attaching a micro electro mechanical systems (MEMS) devices to a substrate.

BACKGROUND

The performance of Micro Electro Mechanical Systems (MEMS) devices is significantly impacted by environmental effects, most typically thermal fluctuations/variations and vibrations. For example, in the field of Quartz resonators (oscillators, monolithic filters, etc.) the center frequency must be maintained over a −40 C and 80 C temperature range to within parts per million (ppm) and in some cases parts per billion (ppb) (See for example: J. R. Vig, "*Quartz Crystal Resonators and Oscillators For Frequency Control and Timing Applications—A Tutorial*" January 2007). This requirement adds the need for a compensation circuit and/or ovenization, significantly increasing the thermal and power budget of the devices. Phase noise requirements of such devices require vibration sensitivity as low as ppb per g of acceleration (see for example R. Filler, "*The Acceleration Sensitivity of Quartz Crystal Oscillators: A Review*", IEEE Transactions of Ultrasonics, Ferroelectrics, and Frequency Control, Vo. 35 No. 3, 1998).

Quartz devices are one of many precision mechanical sensors that suffer from environmental effects. Another example is mechanical gyroscopes. A gyroscope that has a bias stability of 0.01 deg/hr in a laboratory environment will quickly degrade by 10 to 100× in bias stability when taken into the field. Over the years, at the macro scale, designs for flexible mounting, ovenization, and material selections have matured, albeit with increase in cost, size, weight, and power (cSWAP).

At the micro scale the technology has yet to mature, due to a different set of challenges in fabrication and design. In heterogeneously integrated MEMS devices a functional MEMS device structure, for example fabricated from a material such as Quartz, Aluminum nitride, compound semiconductors, etc., is to be assembled to a substrate that can be fabricated from a different material, typically Si or another electronic substrate (Si, InP, GaN, etc). Connections between the device and the substrate are necessary to provide both mechanical support and electrical contact.

FIG. 1 shows a cross section of a prior art wafer scale heterogeneous wafer bonding integration process. In FIG. 1, a MEMS device 10 having connection pads 12 on one side and having another side attached to a handle structure 14, is aligned with matching connection pads 16 on a substrate 18. Substrate 18 may be provided for carrying integrated circuitry (not shown) or additional discrete components (not shown).

FIG. 2 shows a cross section of a MEMS assembly 20 comprising MEMS device 10 attached to substrate 18 by the bonding of connection pads 12 to connection pads 16. Handle 10 was removed after the bonding of connection pads 12 to connection pads 16. A problem arising with MEMS assembly 20 is that, due to the stiff nature of the bond typically created between connection pads 12 and 16, stress and strain may form with thermal variations, due to thermal expansion mismatch between the materials of MEMS 10 and substrate 18. This can occur both during the fabrication process and/or out in the operating environment. Furthermore, due to the stiff nature of the connection, mechanical vibrations are easily transferred directly from the substrate to the device, thus reducing performance of the device.

A known solution used to address thermal expansion mismatch problems, for example in the manufacturing of commercial quartz resonators, comprises gluing the resonator into the package using a conductive epoxy. However, this process is a slow and manually intensive task that increases time and cost of production.

Vibration insensitivity can be designed into the device structure. However, such designs generally make fabrication and operation of the device more difficult.

Another approach to vibration and temperature variation is to build platforms on which the device sits (See for example: S. W. Yoon, "*Vibration Isolation and Shock Protection for MEMS*", Michigan University Thesis, 2009). It is noted however that the design, manufacturing, and operation of such platforms at the micro scale add a significant amount of complexity and cost.

There exist a need for a structure and method allowing to mount a MEMS on a substrate in a fast and economical way, while protecting the MEMS from vibration of the substrate as well as protecting the MEMS and substrate from thermal expansion mismatch between the materials of MEMS and substrate.

SUMMARY OF THE INVENTION

The present disclosure provides for assembling the MEMS to the substrate using flexible conductive mounts or support structures that can be fabricated with CMOS compatible wafer scale fabrication techniques and that only minimally increase the size of the device. The flexible support structures according to the present disclosure are capable of flexing to reduce stress formed by thermal variation, as well as forming a low frequency spring that may be used to reduce the transfer of vibrations to the MEMS.

An embodiment of the present disclosure relates to a MEMS assembly comprising: a substrate and a MEMS device; the MEMS device being connected to the substrate by at least two flexible support structures made in a conductive layer formed on a first portion of one of said substrate and said MEMS.

According to an embodiment of the present disclosure, at least one flexible support structure comprises at least a first wall having a first edge formed on said first portion of one of said substrate and said MEMS, a second edge bonded to the other of said one of said substrate and said MEMS, and a free standing intermediate portion.

According to an embodiment of the present disclosure, said second edge extends into a base portion of the flexible support; said base portion being bonded to the other of said one of said substrate and said MEMS.

According to an embodiment of the present disclosure, said first wall and said base portion result from the etching away of a sacrificial structure formed on a second portion of said one of said substrate and said MEMS, wherein said free standing intermediate portion of the first wall and said base portion were formed on said sacrificial structure.

According to an embodiment of the present disclosure, said flexible support structure comprises a second wall having a first edge formed on said first portion of one of said substrate and said MEMS, a second edge extending from said base portion, and a free standing intermediate portion.

According to an embodiment of the present disclosure, the conductive layer is a metal layer, for example a layer of Au or Al, or Cu, Ti, Cr or of an alloy thereof. More generally, the conductive layer can be any metal layer that can be formed, with the appropriate thickness, via standard semiconductor processing techniques.

According to an embodiment of the present disclosure, at least one of said flexible support structures is etched out of said conductive layer.

According to an embodiment of the present disclosure, said at least two flexible support structures result from etching away a sacrificial structure located between the conductive layer and a second portion of said one of said substrate and said MEMS.

According to an embodiment of the present disclosure, the substrate comprises first and second substrate electrical connection areas, and the MEMS device comprises first and second MEMS electrical connection areas connected to the first and second substrate electrical connection areas by said at least two flexible support structures.

An embodiment of the present disclosure relates to a method of forming a MEMS assembly comprising: providing a substrate; providing a MEMS device; forming a sacrificial structure on one of said substrate and said MEMS; forming a conductive layer on said sacrificial structure and said one of said substrate and said MEMS; forming at least two support structures out of said conductive layer; assembling said support structures to the other of said one of said substrate and said MEMS; and removing said sacrificial structure.

According to an embodiment of the present disclosure, said sacrificial structure comprises at least a first wall portion making an angle with said one of said substrate and said MEMS, and said forming a conductive layer comprises forming a first conductive wall on said first wall portion of said sacrificial structure, a first edge of said first conductive wall being formed on said one of said substrate and said MEMS.

According to an embodiment of the present disclosure, said sacrificial structure comprises a top portion extending from said wall portion, and said forming a conductive layer comprises forming on said top portion of the sacrificial structure a conductive base portion extending from a second edge of said wall portion.

According to an embodiment of the present disclosure, said assembling said support structures to the other of said one of said substrate and said MEMS comprises bonding said conductive base portion to the other of said one of said substrate and said MEMS.

According to an embodiment of the present disclosure, said sacrificial structure comprises a second wall portion extending from the top portion to said one of said substrate and said MEMS; and said forming a conductive layer comprises forming on said second wall portion of said sacrificial structure a second conductive wall extending from said conductive base portion to said one of said substrate and said MEMS.

According to an embodiment of the present disclosure, said conductive layer is a metal layer.

According to an embodiment of the present disclosure, said forming at least two support structures out of said conductive layer comprises etching at least one of said support structures out of said conductive layer.

According to an embodiment of the present disclosure, the substrate comprises first and second substrate electrical connection areas and the MEMS device comprises first and second MEMS electrical connection areas; and said forming at least two support structures out of said conductive layer and said assembling said support structures to the other of said one of said substrate and said MEMS comprise connecting the first and second substrate electrical connection areas to the first and second MEMS electrical connection areas with said at least two support structures.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
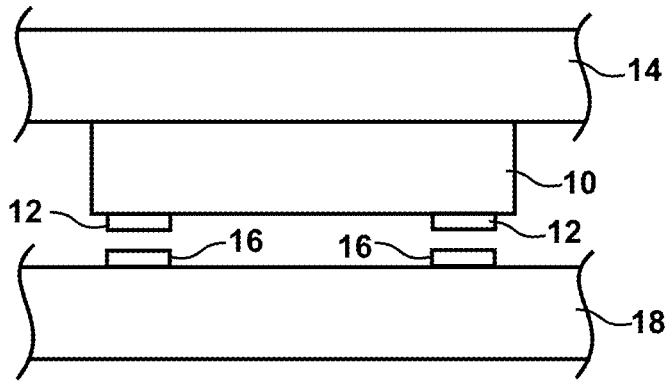
FIG. 1 shows a cross section of a prior art wafer scale heterogeneous wafer bonding integration process.
Figure 2:
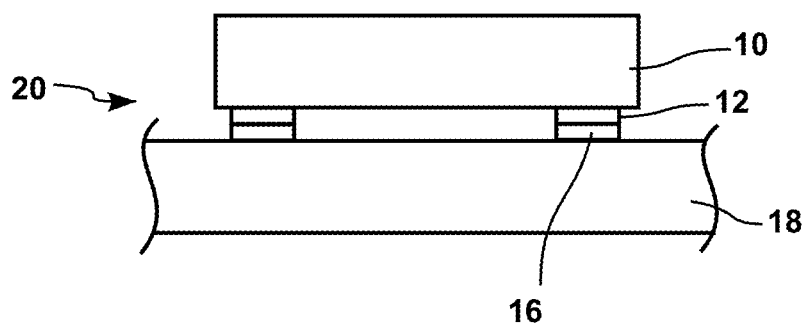
FIG. 2 shows a cross section of a MEMS assembly resulting from the process of claim 1.
Figure 3A:
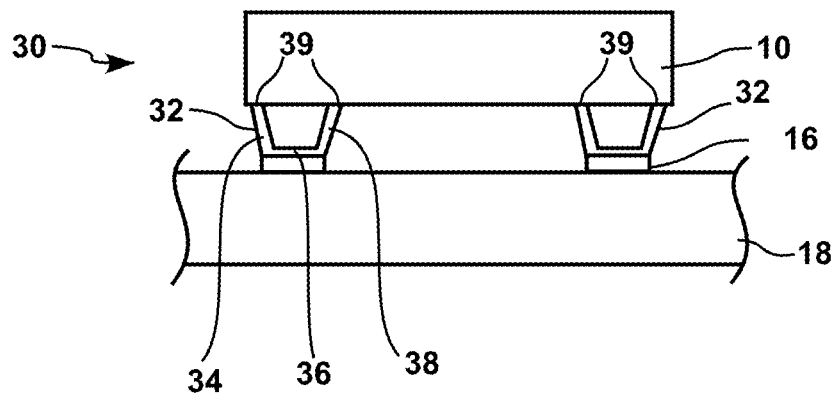
FIG. 3A shows a cross section of a MEMS assembly according to the present disclosure.

FIG. 3A shows a cross section of a MEMS assembly 30 comprising MEMS device 10 attached to substrate 18 by the bonding of flexible support structures 32 pads on connection pads 16. A handle of MEMS 10 was removed after the bonding of flexible support structures 32 on connection pads 16, as detailed hereafter. Substrate 18 can be as substrate 18 of FIG. 1. MEMS 10 and substrate 18 can for example be a quartz resonator and a base substrate such as described in U.S. Pat. No. 7,237,315, which is hereby incorporated by reference.

As detailed hereafter, for example in relation with FIGS. 7A-7F, according to an embodiment of the disclosure the flexible support structures 32 are made out of a conductive layer, formed partly on a portion of the MEMS and partly on top of a sacrificial structure which is later removed.

According to an embodiment of the disclosure, flexible support structure 32 comprises a first wall 34 or ribbon having a first edge formed on the MEMS 10. A second edge of first wall 34 extends into a base portion 36 of the flexible support, which is bonded to the connection pad 16 of substrate 18. A free standing portion of first wall 34 extends between the first and second edges of first wall 34. The free standing portion of first wall 34 is preferably attached only to the first and second edges of first wall 34. According to an embodiment of the disclosure, flexible support structure 32 further comprises a second wall or ribbon 38 having a first edge formed on said MEMS and a second edge extending from said base portion 36. A free standing portion of second wall 38 extends between the first and second edges of second wall 38. The free standing portion of second wall 38 is preferably attached only to the first and second edges of second wall 38. According to an embodiment of the present disclosure, base portion 36 is substantially parallel to the general plane of MEMS 10. According to an embodiment of the present disclosure, walls 34 and 38 form an angle with base 36.

It is noted that support 32 can comprise a single wall, as detailed hereafter for example in relation with FIGS. 8-11. According to an embodiment of the present disclosure, flexible support structure is made out of a metallic layer. However, other conductive layers, such as Polysilicon can be used. Polysilicon refers to Polycrystalline Silicon, that can be deposited via chemical vapor deposition. Another exemplary possibility is a conductive polymer that can be deposited via standard semiconductor processing techniques.

The height of flexible support structure 32 is preferably comprised between 100's of nm to 100's of microns. The depth (the dimension perpendicular to the plane of the paper in FIGS. 3-11) of the flexible support structure is smaller than the depth of the MEMS on which it is formed. The thickness of the conductive layer in which flexible support structure is formed is preferably comprised between 10 nm to 10 microns.

According to the embodiment illustrated in FIG. 3A, flexible support structure 32 is made out of a conductive layer formed partly on a portion of the MEMS and partly on top of a sacrificial structure of the MEMS which is removed after bonding of the support structure on the substrate. However, according to an alternative embodiment, flexible support structure 32 can also be made out of a conductive layer formed partly on a portion of the substrate and partly on top of a sacrificial structure of the substrate which is later removed after bonding of the support structure on the MEMS.

Flexible support structures 32 can be fabricated with CMOS compatible wafer scale fabrication techniques. Advantageously, because the walls 34, 38 of structures 32 have edges formed on MEMS 10, which creates strong attachment of the edges on MEMS 10, structures 32 are firmly attached to MEMS 10 while having a very small contact surfaces with MEMS 10. The contact surfaces of the structures 32 with MEMS 10 can for example be identical to the cross-section (thickness multiplied by depth) of the conductive layer in which flexible support structure is formed. Such small contact surfaces allow for example having a high density of structures 32 attached to MEMS 10. It is noted that the structures 32 formed on MEMS 10 distinguish from structures that would be press-bonded or welded on MEMS 10 in that press-bonded or welded structures would have larger contact surfaces (due to flattened wire or weld ball) with MEMS 10 than structures 32, and would thus not allow the same density as structures 32. The above is particularly true for structures 32 made in a layer having a thickness comprised in the preferred range of 10 nanometer to 10 micrometer. Another difference is that structures 32 are formed at one time across the whole wafer, not serially like wire bonds would be formed. This allows having structures 32 that are more regular and more reliable than wire bonds.

According to the embodiment illustrated in FIG. 3A, walls 34, 38 of the flexible support structure 32 are formed with a substantially straight cross section. However, according to an alternative embodiment, the walls of the flexible support structure can also be formed with a substantially curved or angled cross section. Also, it is noted that the walls of flexible support structure 32 can be full and substantially flat, or can comprise perforations and/or striations.

Preferably, MEMS 10 is attached to substrate 18 using at least two flexible support structures 32 so that support structures 32 can provide a complete electrical connection of MEMS 10 to substrate 18. Connection pads 16 can be electrical connection areas of substrate 18 and the support structures 32 can be formed in contact with electrical connection areas 39 of MEMS 10. According to other embodiments of the present disclosure, MEMS 10 can be attached to substrate 18 using more than two flexible support structures 32, eventually with not all of flexible support structures 32 being used for electrical connection of MEMS 10 to substrate 18.

Figure 3B:
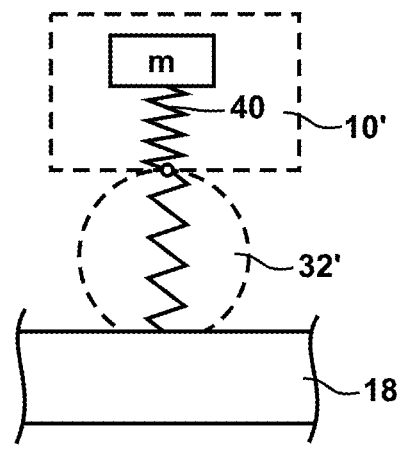
FIG. 3B shows a schematic modelization of the MEMS assembly of FIG. 3A when the MEMS is a mechanical resonator.

FIG. 3B shows a schematic modelization of the MEMS assembly 30, which illustrates how MEMS assembly 30 allows for low frequency vibration dissipation and isolation of MEMS 10 when MEMS 10 is a mechanical resonator. Flexible support structures 32 form a spring 32' between the substrate 10 and the MEMS 10. Spring 32', with the mass m of the MEMS 10, has a resonant frequency $f_m$. Further, if MEMS device 10 is a mechanical resonator having resonant frequency $f_d$, MEMS 10 can be modeled as a mass & spring system 10' comprising mass m and a spring 40 connected to spring 32'. If $f_m$ is significantly lower than $f_d$, vibrations of substrate 18 will be absorbed in the mount spring 32' and will not be transferred to MEMS 10. Assuming that MEMS device 10 is a high frequency resonator, operating at frequencies, varying from 10's of kHz to 10's of GHz, it is possible to design flexible support structures 32 that forms a low frequency mount spring 32' that will absorb the vibrations from substrate 18. Metals are very good mechanical energy absorbers so the vibrations from substrate 18 will be particularly efficiently dissipated when flexible support structures 32 are made of metal.

Figure 4:
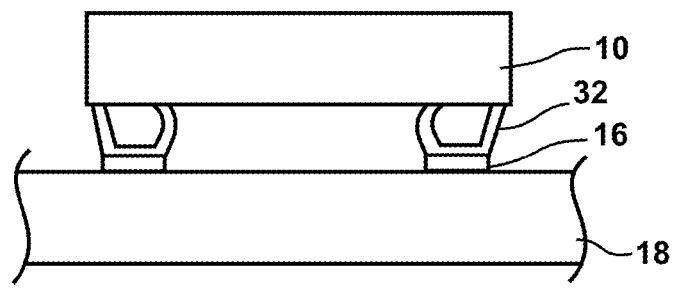
FIG. 4 shows a cross section of the MEMS assembly of FIG. 3 when the MEMS expands thermally more than the substrate.

FIG. 4 shows a cross section of the MEMS assembly of FIG. 3 when the MEMS 10 expands thermally more than the substrate 18. The angle between the outer walls of flexible support structures 32 and their base portions increases, while the inner walls of flexible support structures 32 bend inwardly. The change in shape of flexible support structures 32 lowers the height of MEMS 10 with respect to substrate 18. Instead of stress building up in the MEMS due to the MEMS expanding thermally more than substrate 18, the stress is relieved by flexing support structures 32.

Figure 5:
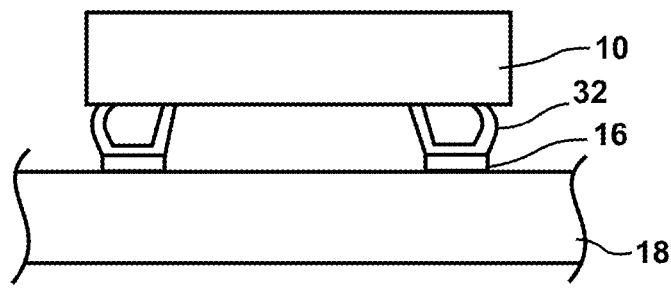
FIG. 5 shows a cross section of the MEMS assembly of FIG. 3 when the substrate expands thermally more than the MEMS.

FIG. 5 shows a cross section of the MEMS assembly of FIG. 3 when the substrate expands thermally more than the MEMS. The angle between the inner walls of flexible support structures 32 and their base portions widens, while the outer walls of flexible support structures 32 bend outwardly. The change in shape of flexible support structures 32 lowers the height of MEMS 10 with respect to substrate 18. Again, the flexing of support structures 32 relieves MEMS 10 from stress build up.

Figure 6:
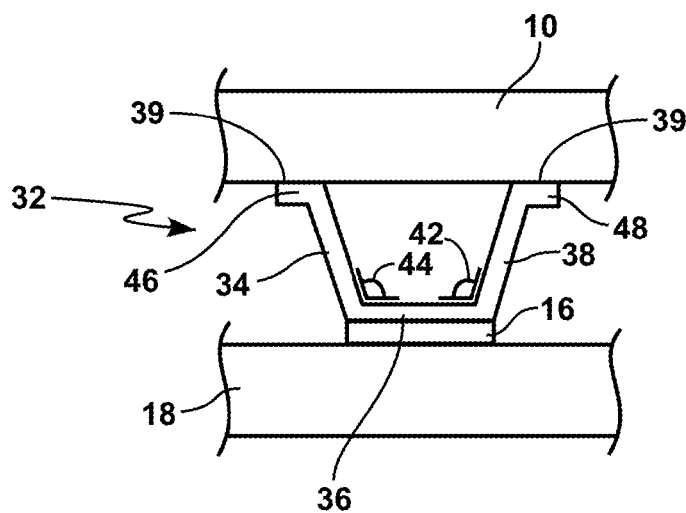
FIG. 6 shows a cross section of one flexible support structure of the assembly of FIG. 3.

FIG. 6 shows an enlarged a cross section of an embodiment of one flexible support structure 32 according to the present disclosure, showing the angle 42, 44 between base portion 36 and walls 38, 34. It is noted that angles 42, 44 can be formed equal or different. According to the embodiment shown in FIG. 6, the edges of walls 34, 38 that are formed on MEMS 10 extend slightly along the surface of MEMS 10 to form additional attachment portions 46, 48 of flexible support structure 32 to MEMS 10. As detailed hereafter in relation with FIGS. 7A-7F, attachment portions 46, 48 are formed from the same conductive layer as flexible support structure 32. The size of attachment portions 46, 48 is determined when etching flexible support structure 32 out of the conductive layer. According to an embodiment of the present disclosure, attachment portions 46, 48 can make the contact area of structure 32 with MEMS 10 up to three times larger than the cross-section (thickness multiplied by depth) of the conductive layer in which structure 32 is formed. Preferably, the attachment portions 46, 48, as well as the edges of walls 34, 38 formed on MEMS 10, are formed in contact with electrical connection areas 39 of MEMS 10. FIGS.

FIGS. 7A-7F illustrate a manufacturing process of the assembly of FIG. 3.

Figure 7A:
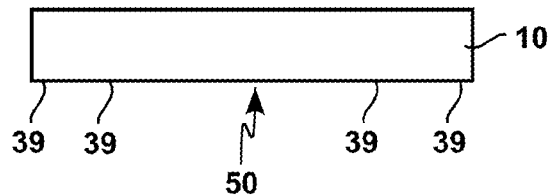
FIGS. 7A-7F illustrate a manufacturing process of the assembly of FIG. 3.

In FIG. 7A a MEMS device 10 is provided. MEMS 10 comprises electrical connection areas 39 on a surface 50.

Figure 7B:
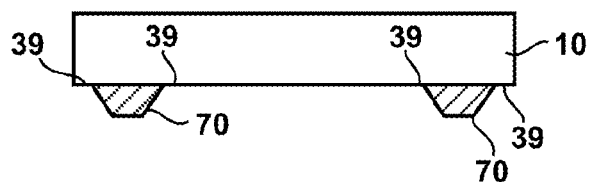

In FIG. 7B a sacrificial structure 70 is formed on surface 50, in the vicinity of electrical connection areas 39. The material of sacrificial structure 70 is chosen so that it can later be removed without damaging the final structure, but also so that it can withstand the force and pressure needed for a bonding process such as illustrated hereafter in FIG. 7E. The material of sacrificial structure 70 can comprise a hard polymer, a dielectric, or amorphous PECVD Silicon. The sacrificial structure 70 can be formed using a manufacturing process adapted to forming a structure in the material of the sacrificial structure. For example, a polymer sacrificial structure can be formed by etching, from a polymer layer spin-spread on surface 50. A dielectric sacrificial structure can be formed by etching, from a dielectric layer grown on surface 50. An amorphous PECVD silicon sacrificial structure can be formed by etching, from a PECVD silicon layer formed on surface 50. Removal of the sacrificial structure can comprise wet etching or plasma etching of the material of sacrificial structure 70. Sacrificial structure removal is for example described in "Microsystem Design", by S. D. Senturia, 2005, ISBN 0-7923-7246-8. According to an embodiment of the present disclosure, the sacrificial material can be polyimide and it can be etched/removed using oxygen plasma. According to an embodiment of the present disclosure, the sacrificial material can be photoresist and it can be etched/removed using a solvent or oxygen plasma. According to an embodiment of the present disclosure the sacrificial material can be a dielectric and it can be etched/removed either by solvent or plasma etching. According to an embodiment of the present disclosure the sacrificial material can be Silicon formed by PECVD and it can be etched/removed either by solvent or plasma etching.

Figure 7C:
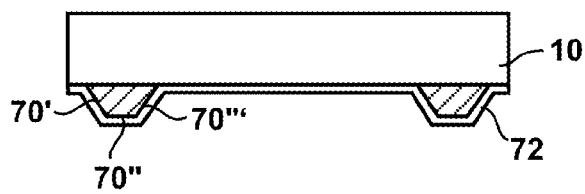

In FIG. 7C, a conductive layer 72, for example a thin layer of metal, is formed on the portions of surface 50 not covered by sacrificial structure 70, and on sacrificial structure 70.

Figure 7D:
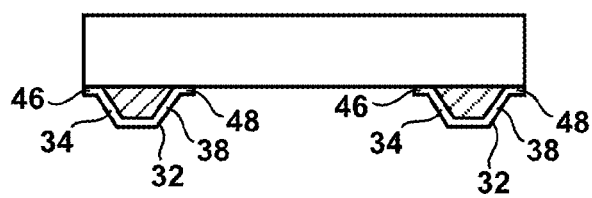

In FIG. 7D, electrically conductive layer 72 is etched, for example using a photolithographic process, to form support structures 32, such that the edges of the walls 34, 38 of support structures 32 that were formed in contact with surface 50 are in contact with electrical connection areas 39 of MEMS 10. FIG. 7D illustrates optional attachment portions 46, 48 of walls 34, 38 on surface 50. Further patterning of the conductive layer at this stage can lead to striated or perforated support structures 32. It is noted that, instead of covering MEMS 10 with conductive layer 72 and then etching conductive layer 72 to form support structures 32, an alternative embodiment of the present disclosure provides for forming directly support structures 32 using a mask. According to an embodiment of the present disclosure, support structure 32 can be formed using photolithography process steps. According to an embodiment of the present disclosure, support structure 32 can be formed using PVD or CVD. Forming support structures 32 directly by ion beam assisted deposition is also contemplated for small support structures 32. In the illustrated embodiment, sacrificial structure 70 comprises first wall portions 70' making an angle with surface 50, top portions 70" extending from said wall portions substantially parallel to surface 50 and second wall portions 70''' extending from the top portions 70" to surface 50. Walls 34, 38 and base portions 36 of support structure are formed on wall portions 70', 70''' and top portions 70" of sacrificial structure 70.

Figure 7E:
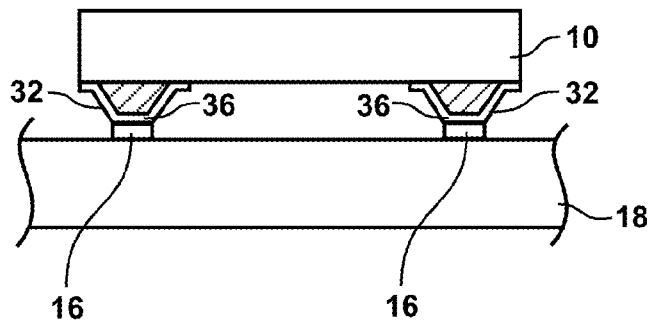

In FIG. 7E, MEMS 10 is assembled to substrate 18 by bonding the bases 36 of support structures 32 on connection pads 16 of substrate 18, which form electrical connection areas of substrate 18. A bonding material (not shown) can be applied to bases 36 and/or pads 16 for the bonding.

Figure 7F:
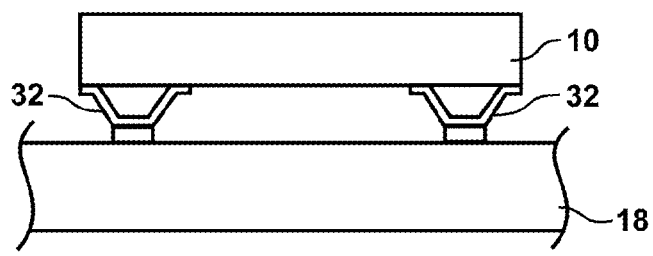

In FIG. 7F, sacrificial structure 70 is removed by etching, thus forming the free standing portions of the walls of support structures 32. Support structures 32 are made flexible essentially by the free standing portions of their walls. During the process, MEMS 10 can be attached to a handle (not shown). The handle could then be removed prior to removing the sacrificial material. Because the free standing portions of the walls of support structures 32 are formed on sacrificial structure 70, removal of sacrificial structure 70 gives to at least one surface of the free standing portions of the walls the particular texture of a surface formed on a sacrificial structure before being cleaned by etching. For example at least one surface of the free standing portions of the walls may comprise irregularities matching, in negative, the texture of the sacrificial support on which they were formed, and/or may comprise some small texture recesses containing residues of the sacrificial support or residues formed by the etching of the sacrificial support. The inventors have determined that such texture is not detrimental to a satisfactory operation of flexible support structures 32. According to an embodiment of the present disclosure, after removal of the sacrificial structure 70, MEMS 10 is attached to substrate 18 only by support structures 32.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. For example, the present disclosure is not limited to the process disclosed in relation with in FIGS. 7A-7F. Possible variations on the process can include starting the process on the substrate 18 instead of on the MEMS 10, which would in substance mean replacing substrate 18 and MEMS 10 in FIGS. 7A-7F and where appropriate in the corresponding portions of the description.

Figure 8:
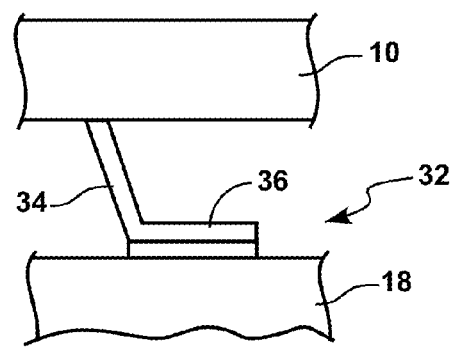
FIG. 8 shows a cross section of a first alternative flexible support structure according to the present disclosure.

FIG. 8 illustrates an alternative embodiment of support structures 32 wherein support structure 32 comprises a single wall, for example wall 34.

Figure 9:
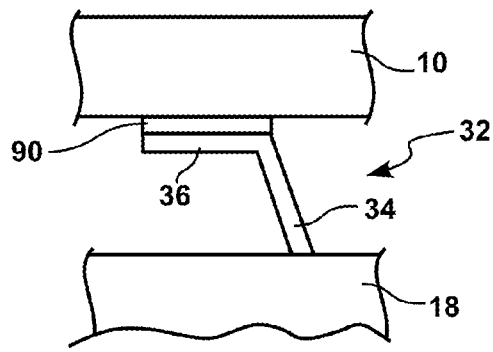
FIG. 9 shows a cross section of a second alternative flexible support structure according to the present disclosure.

FIG. 9 illustrates an alternative embodiment of support structures 32 wherein support structure 32 comprises a single wall 34, and wherein instead of having been formed on MEMS 10, structure 32 was formed on substrate 18 using a process similar to the process used for forming structure 32 on MEMS 10, and was then bonded to a contact pad 90 of MEMS 10. It is noted that according to embodiments of the present disclosure, support structures 32 having one or two walls can be formed on substrate 18 and then attached/bonded to MEMS 10 instead of being formed on MEMS 10 and then attached/bonded to substrate 18. To this end, the present disclosure would be read by inverting references to MEMS 10 and substrate 18 where appropriate.

Figure 10:
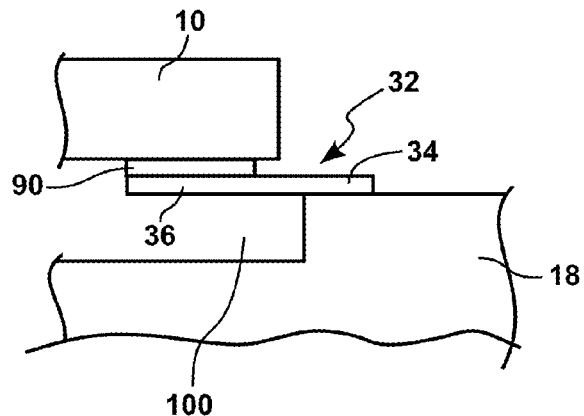
FIG. 10 shows a cross section of a third alternative flexible support structure according to the present disclosure.

FIG. 10 illustrates an alternative embodiment of support structures 32 wherein, as in FIG. 9, structure 32 was formed on substrate 18 and was bonded to a contact pad 90 of MEMS 10. In addition, in this alternative embodiment wall 34 and base portion 36 of the flexible support structures 32 make an angle of 180 degree, whereas flexible support structures 32 hold MEMS 10 above a recess 100 in substrate 18; the length and width of recess 100 being larger than the length and width of MEMS 10. The free standing portions of wall 34 is comprised between base portion 36 and the portion of wall 34 bonded to pad 90. Preferably, the free standing portion is attached only to base portion 36 and the portion of wall 34 bonded to pad 90.

Figure 11:
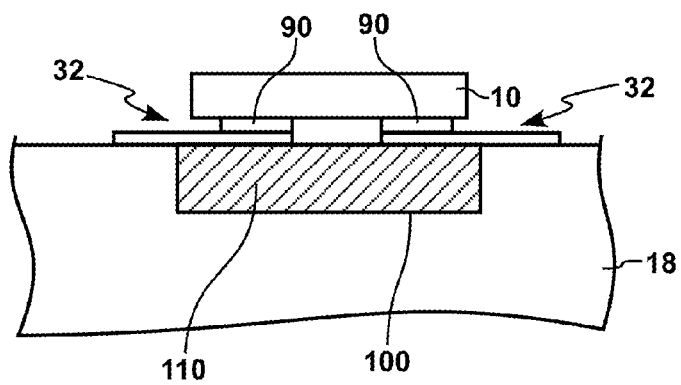
FIG. 11 illustrates the manufacturing of the third alternative flexible support structure of FIG. 10.

FIG. 11 illustrates the manufacturing of the flexible support structure of FIG. 10. Recess 100 is filled with a sacrificial structure 110 before support structures 32 are formed partly on substrate 18 around recess 100 and partly on sacrificial structure 110, before MEMS 10 is attached/bonded to support structures 32 and sacrificial structure 110 is removed, for example by etching as disclosed hereabove in relation with FIGS. 7A-F. According to an embodiment of the present disclosure, a support structure 32 such as illustrated in FIG. 11 can be a ribbon (plain, striated, or perforated) or can have any various forms of a serpentine structure.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. A MEMS assembly comprising:
   a substrate; and
   a MEMS device;
   wherein the MEMS device is connected to the substrate by at least two flexible support structures made in a conductive layer formed on a first portion of one of said substrate and said MEMS.

2. The MEMS assembly of claim 1, wherein at least one flexible support structure comprises at least a first wall having a first edge formed on said first portion of one of said substrate and said MEMS, a second edge bonded to the other of said one of said substrate and said MEMS, and a free standing intermediate portion.

3. The MEMS assembly of claim 2, wherein said second edge extends into a base portion of the flexible support; said base portion being bonded to the other of said one of said substrate and said MEMS.

4. The MEMS assembly of claim 3, wherein said first wall and said base portion result from the etching away of a sacrificial structure formed on a second portion of said one of said substrate and said MEMS, wherein said free standing intermediate portion of the first wall and said base portion were formed on said sacrificial structure.

5. The MEMS assembly of claim 4, wherein said flexible support structure comprises a second wall having a first edge formed on said first portion of one of said substrate and said MEMS, a second edge extending from said base portion, and a free standing intermediate portion.

6. The MEMS assembly of claim 1, wherein the conductive layer is a metal layer.

7. The MEMS assembly of claim 1, wherein at least one of said flexible support structures is etched out of said conductive layer.

8. The MEMS assembly of claim 1, wherein said at least two flexible support structures result from etching away a sacrificial structure located between the conductive layer and a second portion of said one of said substrate and said MEMS.

9. The MEMS assembly of claim 1, wherein the substrate comprises first and second substrate electrical connection areas, and the MEMS device comprises first and second MEMS electrical connection areas connected to the first and second substrate electrical connection areas by said at least two flexible support structures.

10. The MEMS assembly of claim 9, wherein said first and second substrate electrical connection areas are located on a first surface of said substrate, and said first and second MEMS electrical connection areas are located on a first surface of said MEMS device; said first and second substrate electrical connection areas being connected directly to said first and second MEMS electrical connection areas by said at least two flexible support structures, respectively; and
   wherein said at least two flexible support structures are arranged to change in shape such that said first surface of said MEMS device and said first surface of said substrate remain parallel if the substrate expands thermally differently from the MEMS.

11. The MEMS assembly of claim 1, wherein at least one flexible support structure comprises a single wall having a first edge formed on said first portion of one of said substrate and said MEMS, a second edge bonded to the other of said one of said substrate and said MEMS, and a free standing intermediate portion.

12. The MEMS assembly of claim 1, wherein a first surface of said MEMS device is connected directly to a first surface of said substrate by said at least two flexible support structures; and
   wherein said at least two flexible support structures are arranged to change in shape such that said first surface of said MEMS device and said first surface of said substrate remain parallel if the substrate expands thermally differently from the MEMS.

13. A method of forming a MEMS assembly comprising:
providing a substrate;
providing a MEMS device;
forming a sacrificial structure on one of said substrate and said MEMS;
forming a conductive layer on said sacrificial structure and said one of said substrate and said MEMS;
forming at least two support structures out of said conductive layer;
assembling said support structures to the other of said one of said substrate and said MEMS; and
removing said sacrificial structure.

14. The method of claim 13, wherein said sacrificial structure comprises at least a first wall portion making an angle with said one of said substrate and said MEMS, wherein said forming a conductive layer comprises forming a first conductive wall on said first wall portion of said sacrificial structure, a first edge of said first conductive wall being formed on said one of said substrate and said MEMS.

15. The method of claim 14, wherein said sacrificial structure comprises a top portion extending from said wall portion, wherein said forming a conductive layer comprises forming on said top portion of the sacrificial structure a conductive base portion extending from a second edge of said wall portion.

16. The method of claim 15, wherein said assembling said support structures to the other of said one of said substrate and said MEMS comprises bonding said conductive base portion to the other of said one of said substrate and said MEMS.

17. The method of claim 15, wherein said sacrificial structure comprises a second wall portion extending from the top portion to said one of said substrate and said MEMS; and
wherein said forming a conductive layer comprises forming on said second wall portion of said sacrificial structure a second conductive wall extending from said conductive base portion to said one of said substrate and said MEMS.

18. The method of claim 13, wherein said conductive layer is a metal layer.

19. The method of claim 13, wherein said forming at least two support structures out of said conductive layer comprises etching at least one of said support structures out of said conductive layer.

20. The method of claim 13, wherein the substrate comprises first and second substrate electrical connection areas and the MEMS device comprises first and second MEMS electrical connection areas; and
wherein said forming at least two support structures out of said conductive layer and said assembling said support structures to the other of said one of said substrate and said MEMS comprise connecting the first and second substrate electrical connection areas to the first and second MEMS electrical connection areas with said at least two support structures.

* * * * *